United States Patent
Chida et al.

(10) Patent No.: US 7,443,327 B2
(45) Date of Patent: Oct. 28, 2008

(54) CURRENT-OUTPUT TYPE DIGITAL-TO-ANALOG CONVERTER

(75) Inventors: Taisuke Chida, Kyoto (JP); Kunihiro Komiya, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/807,539

(22) Filed: May 29, 2007

(65) Prior Publication Data

US 2007/0279270 A1    Dec. 6, 2007

(30) Foreign Application Priority Data

May 30, 2006   (JP)   ............... 2006-149375

(51) Int. Cl.
  *H03M 1/66* (2006.01)
(52) U.S. Cl. .................. 341/144; 341/135; 341/136
(58) Field of Classification Search .......... 341/135, 341/136, 144
  See application file for complete search history.

(56) References Cited

U.S. PATENT DOCUMENTS

| | | | | |
|---|---|---|---|---|
| 4,982,192 A | * | 1/1991 | Murooka | .................. 341/127 |
| 6,683,549 B2 | * | 1/2004 | Kinugasa | ................... 341/136 |
| 6,917,322 B2 | * | 7/2005 | Ueno et al. | ................. 341/144 |
| 7,019,676 B2 | * | 3/2006 | Ikoma et al. | ................ 341/144 |

FOREIGN PATENT DOCUMENTS

| | | |
|---|---|---|
| JP | 2002-330072 | 11/2002 |
| JP | 2004-22929 | 1/2004 |

* cited by examiner

*Primary Examiner*—Khai M Nguyen
(74) *Attorney, Agent, or Firm*—Cantor Colburn LLP (57) ABSTRACT

Source potentials of n output transistors are fixed by common fixed voltage, and sources are connected to a current output terminal. A drain and a gate of an input transistor are commonly connected to the drains and the gates of the output transistors respectively. A first current-to-voltage conversion unit is connected onto the drain side of the input transistor to convert current Im2 flowing through the input transistor into voltage Vx1. A second current-to-voltage conversion unit converts reference current Iref into voltage Vx2. The voltages Vx1 and Vx2 are input to a first error amplifier, and the first error amplifier adjusts gate voltages of the input transistor and output transistors. n switches are provided on a path through which output of the first error amplifier reaches the gate of the output transistor. A control unit controls on/off of the switch according to a digital signal.

11 Claims, 6 Drawing Sheets

CURRENT-OUTPUT TYPE DIGITAL-TO-ANALOG CONVERTER

BACKGROUND OF THE INVENTION

1. Field of the Invention

The present invention relates to a current-output type digital-to-analog converter which generates and outputs an output electric current according to an input digital signal.

2. Description of the Related Art

Recently, in a field of compact information terminals such as a portable telephone and PDA (Personal Digital Assistance), there is a device requiring higher voltage than an output voltage of a battery, such as a light emitting diode (hereinafter referred to as LED) used in a back light of a liquid crystal display. In such compact information terminals, a lithium ion battery is frequently used. The output voltage of lithium ion battery is usually about 3.5V, and about 4.2V even in a fully-charged state. However, the voltage higher than the battery voltage is required as the drive voltage of an LED. In the case where the voltage higher than the battery voltage is required, the battery voltage is boosted to obtain the voltage necessary to drive a load circuit such as an LED using a booster-type power supply device in which a switching regulator or a charge pump circuit is used.

When an LED is driven by the booster-type power supply device, a constant current circuit is connected onto an LED driving path to keep a current flowed through LED constant, thereby stabilizing control of emission brightness. To achieve this, a method, of monitoring a voltage at a connection point between an LED and generating a drive voltage of the LED to keep the voltage being monitored constant, may be applied (see Japanese Patent Application Laid-Open No. 2004-22929).

[Patent Document 1] Japanese Patent Application Laid-Open No. 2004-22929

[Patent Document 2] Japanese Patent Application Laid-Open No. 2002-330072

Here, the way to switch the current generated by the constant current circuit according to an input digital value in order to adjust the brightness of LED is considered. Generally, digital-to-analog conversion is performed on the digital value to convert the digital value into the voltage, and the voltage-to-current conversion is performed on the voltage to generate the desired constant current. That is, the constant current circuit functions as a current-output type digital-to-analog converter.

However, in the constant current circuit, when the voltage-to-current conversion is performed, the input voltage of the voltage-to-current conversion circuit varies in a wide range according to the digital signal. Therefore, there is a problem that good linearity is required in the wide range of input voltage for in voltage-to-current conversion circuit. In many cases, the voltage-to-current conversion circuit is designed using an operational amplifier, and it is very difficult to keep good linearity of the operational amplifier in the wide range of input voltage. Accordingly, in the current-output type digital-to-analog converter of the above-mentioned type, there is a problem that conversion accuracy is decreased.

SUMMARY OF THE INVENTION

In view of the foregoing, a general purpose of the invention is to provide a current-output type digital-to-analog converter having higher accuracy.

One embodiment of the present invention relates to a current-output type digital-to-analog converter which receives an n-bit (n is a natural number) digital signal and outputs a constant current from a current output terminal according to the input digital signal. The current-output type digital-to-analog converter includes n output transistors each of which has a first terminal, the potential of which is fixed by a common fixed voltage and a second terminal located on a side opposite the first terminal and connected to the current output terminal; an input transistor of which has a first terminal and a control terminal commonly connected to those of the n output transistors; a first current-to-voltage conversion unit which is connected onto a second terminal side of the input transistor to convert a current flowing through the input transistor into a voltage; a constant current source which generates a reference current; a second current-to-voltage conversion unit which converts the reference current into a voltage; a first error amplifier to which, each of output voltages of the first and second current-to-voltage conversion units are input to adjust voltages at the control terminals of the input transistor and the n output transistors; n switches which are provided on a path through which an output of the first error amplifier reaches the control terminals of the n output transistors; and a control unit which controls on/off of the n switches according to the n-bit digital signal.

As used herein, the control terminal of the transistor shall mean a gate terminal in FET (Field Effect Transistor) and a base terminal in a bipolar transistor. According to the embodiment of the invention, the first error amplifier performs feedback control with the voltage at the control terminals of the input transistor and output transistors such that the voltages output from the first and second current-to-voltage conversion unit are brought close to each other. As a result, the constant current is flowed through the output transistor is in proportion with the reference current. The on/off of the n transistors are switched by switching the switch according to the digital signal, and the current can be flowed through the circuit connected to the current input terminal according to the digital signal.

The current-output type digital-to-analog converter according to the embodiment of the invention may further include a voltage adjustment unit which is connected to the second terminal of the input transistor, to make an adjustment to bring a voltage at the second terminal of the input transistor close to a predetermined reference voltage.

The current flowing through each output transistor can be stabilized by fixing the voltage at one end of the input transistor to the reference voltage, and the accuracy of the digital-to-analog converter can be improved.

The voltage adjustment unit may include an adjustment transistor which is connected to the input transistor in series; and a second error amplifier to which a voltage at a connection point between the input transistor and the adjustment transistor and the predetermined reference voltage are input to adjust a voltage at a control terminal of the adjustment transistor.

In this case, the voltage at the second terminal of the input transistor to be fixed to the reference voltage by constituting a three-terminal regulator with the adjustment transistor and the second error amplifier.

The predetermined reference voltage may be set to the same voltage as that at the current output terminal.

In this case, because the voltage at the current output terminal is equal to the voltage at the second terminal of the input transistor, the same potentials are obtained at the three terminals in the input transistor and the n output transistors. Therefore, the current can accurately be generated according to the size ratio of the transistors, and the accuracy of the digital-to-analog conversion can be improved.

The predetermined reference voltage may be set to operate the input transistor in a non-constant current region.

As used herein, the non-constant current region shall mean a region where the flowing current varies when the voltage across the transistor is changed, shall mean an ohmic region (or triode region) in FET, and shall mean a saturation region in the bipolar transistor.

In this case, because the input transistor and the n output transistors are operated in the non-constant current region, the voltage drop across each transistor can be reduced, and the power consumption can be decreased. The conventional current-mirror circuit is operated in the non-constant current region, which affects the mirror ratio. On the other hand, according to the embodiment of the invention, because the same potentials are obtained at the three terminals in the input transistor and the output transistor, the current can flow through each transistor according to the area ratio, and the digital-to-analog conversion is realized with high accuracy.

The first current-to-voltage conversion unit may include a first detection transistor which is provided on the same current path as the input transistor; a second detection transistor which is connected to the first detection transistor in a current-mirror manner; and a first reference resistor which is provided on the same current path as the second detection transistor and one end of the first reference resistor is fixed by the common fixed voltage. The second current-to-voltage conversion unit may include a second reference resistor which is provided on path of the reference current, a potential at one end of the second reference resistor being fixed by the common fixed voltage. A potential at the other end of each of the first and second reference resistors maybe input as outputs of the first and second current-to-voltage conversion units to the first error amplifier.

Another embodiment of the invention relates to a load driving apparatus. The load driving apparatus includes a current-output type digital-to-analog converter which generates an output current according to an input n-bit (n is a natural number) digital signal and outputs the output current from a current output terminal; and a voltage generation unit which supplies a drive voltage to a load circuit connected to the current output terminal of the current-output type digital-to-analog converter. The current-output type digital-to-analog converter includes n output transistors each of which has a first terminal, the potential of which is fixed by a common fixed voltage and a second terminal located on a side opposite the first terminal and connected to the current output terminal; an input transistor of which has a first terminal and a control terminal commonly connected to those of the n output transistors; a first current-to-voltage conversion unit which is connected onto a second terminal side of the input transistor to convert a current flowing through the input transistor into a voltage; a constant current source which generates a reference current; a second current-to-voltage conversion unit which converts the reference current into a voltage; a first error amplifier to which, each of output voltages of the first and second current-to-voltage conversion units are input to adjust voltages at the control terminals of the input transistor and the n output transistors; n switches which are provided on a path through which an output of the first error amplifier reaches the control terminals of the n output transistors; and a control unit which controls on/off of the n switches according to the n-bit digital signal.

According to the embodiment of the invention, the current flowing through the load can accurately be switched according to the digital value.

Still another embodiment of the invention relates to an electronic instrument. The electronic instrument includes a light emitting device; and the load driving apparatus according to above described embodiment of the invention which drives the light emitting device as a load circuit.

According to the embodiment of the invention, brightness of the light emitting device can accurately be adjusted with the reference current.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Preferred embodiments of the invention will be described below with reference to the drawings. The same or equivalent component, member, and process in the drawings are denoted by the same numerals, and the descriptions will not be repeated to eliminate overlapping description. The invention is not limited to the embodiments, but the embodiments are illustrated only by way of example. The features and combinations thereof described in the embodiments are always not necessarily essential to the invention.

First Embodiment

Figure 1:
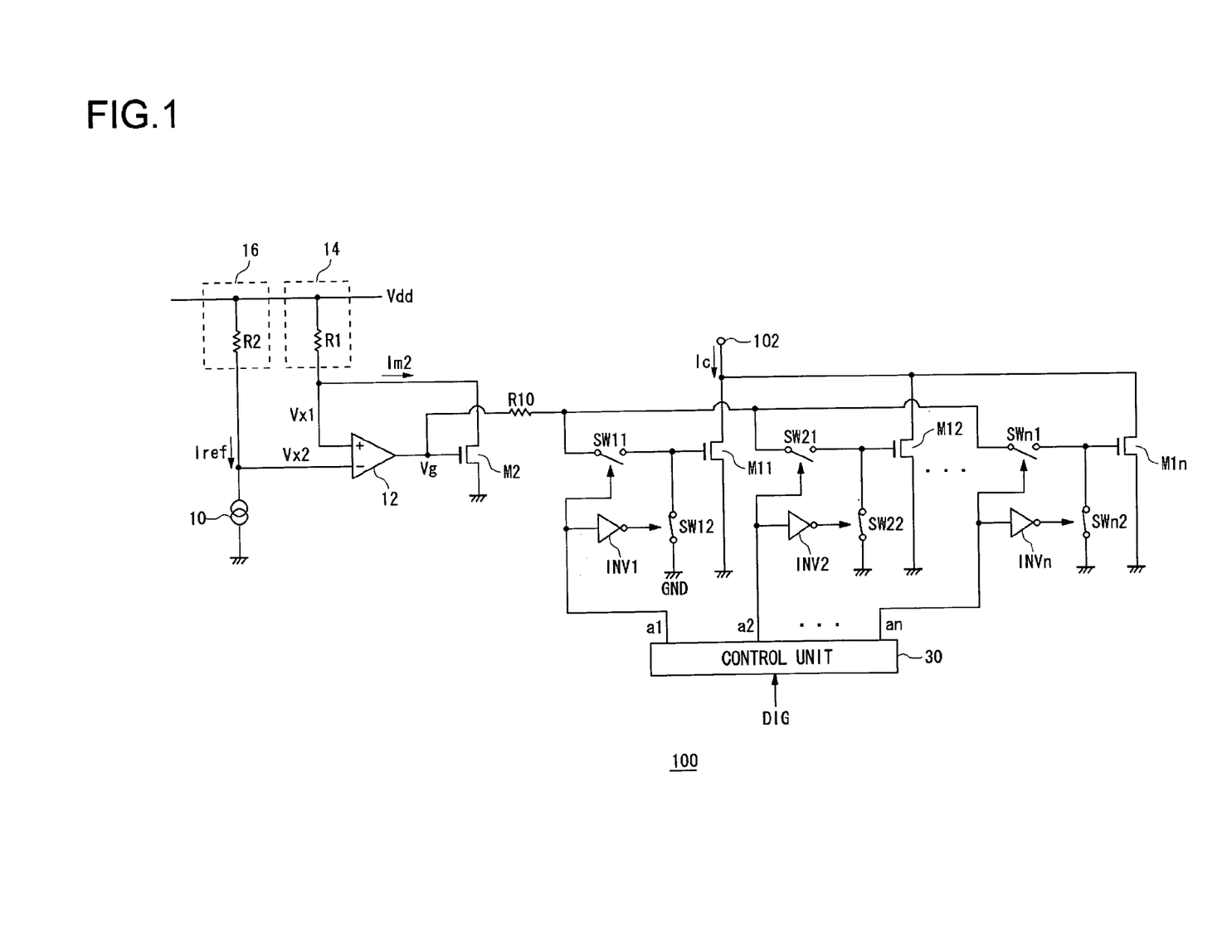
FIG. 1 is a circuit diagram showing a configuration of a current-output type digital-to-analog converter according to a first embodiment of the invention.

FIG. 1 is a circuit diagram showing a configuration of a current-output type digital-to-analog converter 100 (hereinafter also referred to as current DAC 100) according to a first embodiment of the invention.

The current DAC 100 receives n-bit (n is a natural number) digital signal DIG, and the current DAC 100 outputs a constant electric current Ic according to the input digital signal DIG from a current output terminal 102.

The current DAC 100 includes n (n is a natural number) output transistors M11 to M1n, an input transistor M2, a constant current source 10, a first error amplifier 12, a first current-to-voltage conversion unit 14, and a second current-to-voltage conversion unit 16.

The output transistors M11 to M1n are N-type MOSFETs, each of which having a first terminal, that is a source, is fixed by a common fixed voltage, that is a ground voltage, and a second terminal located on a side opposite the first terminal, that is a drain, is connected to a current output terminal 102.

The output transistors M11 to M1n are designed so as to have transistor sizes in ratio of $1:2:4\ldots:2^{(n-1)}$.

The input transistor M2 is a transistor of the same type with the n output transistors M11 to M1n, that is, an N-type MOSFET. In the input transistor M2, a source and a gate as a control terminal are connected to common, thereby forming a so-called current-mirror connection. As described later, on/off of the output transistors M11 to M1n are individually controlled, and the sum of currents, which are passed through each of the output transistors M11 to Min, is output as the constant current Ic from the current output terminal 102.

The first current-to-voltage conversion unit 14 is connected onto the side of the drain, which is the second terminal of the input transistor M2, and converts a current Im2 flowing through the input transistor M2 into a voltage Vx1. In this embodiment, the first current-to-voltage conversion unit 14 includes a first resistor R1. The first resistor R1 has one end connected to the drain terminal of the input transistor M2, and the other end applied with a second fixed voltage (hereinafter also referred to as power supply voltage Vdd). The current Im2 flowed through the input transistor M2 flows through the first resistor R1 to cause a voltage drop of R1×Im2. The output voltage Vx1 of the first current-to-voltage conversion unit 14 becomes Vx1=Vdd−R1×Im2. Thus, the first current-to-voltage conversion unit 14 converts the current Im2 flowing through the input transistor M2 into the voltage Vx1.

The constant current source 10 generates a reference current Iref.

The second current-to-voltage conversion unit 16 includes a second resistor R2. The second resistor R2 has one end connected to the constant current source 10, and the other end is applied with power supply voltage Vdd. The reference current Iref generated by the constant current source 10 flows through the second resistor R2 to cause the voltage drop of R1×Im2. An output voltage Vx2 of the second current-to-voltage conversion unit 16 becomes Vx2=Vdd−R2×Iref.

Thus, the second current-to-voltage conversion unit 16 converts the reference current Iref into the voltage Vx2.

The output voltage Vx1 of the first current-to-voltage conversion unit 14 is input to a non-inverting input terminal of the first error amplifier 12, and the output voltage Vx2 of the second current-to-voltage conversion unit 16 is input to an inverting input terminal. An output terminal of the first error amplifier 12 is connected to the gates of the output transistors M11 to M1n and the input transistor M2, and a gate voltage Vg is adjusted such that the voltages Vx1 and Vx2 are equal to each other.

n switches SW11 to SWn1 and n switches SW12 to SWn2 are provided on a path through which the output of the first error amplifier 12 reaches the gates of the n output transistors M11 to M1n. Either each of the switches SW11 to SWn1 or each of the switches SW12 to SWn2 connected to the same gate is turned on. Each of inverters INV1 to INVn is provided such that the two switches connected to the same gate are not simultaneously turned on. Only the switches SW11 to SWn1 or the switches SW12 to SWn2 maybe provided for the gates of the output transistors M11 to M1n.

The n-bit digital signal DIG is input to a control unit 30. The control unit 30 controls on/off of the n switches according to a value of each bit of the input digital signal DIG. The least significant bit of the n-bit digital signal corresponds to the on/off of the switches SW11 and SW12 connected to the output transistor M11, and the most significant bit corresponds to the on/off of the switches SWn1 and SWn2 connected to the output transistor M1n. That is, the output transistor corresponding to the bit is turned on when the bit is "1", and the output transistor corresponding to the bit is turned off when the bit is "0".

A stabilizing resistor R10 is provided on the path from the first error amplifier 12 to the gates of the n output transistors M11 to M1n due to a following reason. A capacitance of the switch SW and a gate capacitance of the output transistor vary according to the on/off of the switches to fluctuate an impedance required according to the output of the first error amplifier 12. Therefore, the oscillation or instability of the circuit may be prevented by providing the stabilizing resistor R10. Because the gates of the output transistors M11 to M1n have high impedance, the current does not flow through the stabilizing resistor R10, and the voltage drop is not generated. Therefore, the gate of the input transistor M2 is equal to the gates of the output transistors M11 to M1n in the voltage. The stabilizing resistor R10 may be eliminated.

An operation of the current DAC 100 having the above configuration will be described below. The first error amplifier 12, the input transistor M2, and the first current-to-voltage conversion unit 14 form a feedback loop, and the voltage Vx1 vary according to the output voltage of the first error amplifier 12, that is, the gate voltage Vg of the input transistor M2.

As a result, the first error amplifier 12 performs feedback control to the gate voltage Vg of the input transistor M2 such that the voltage Vx1 applied to the non-inverting input terminal is equal to the voltage Vx2 of the inverting input terminal. That is, the gate voltage Vg of the input transistor M2 is adjusted so as to become Vdd−R2×Iref=Vdd−R1×Im2. In this case, the current Im2 flowing through the input transistor M2 is given by Im2=R2/R1×Iref.

Because the output transistors M11 to M1n and the input transistor M2 form the current-mirror circuit in which the gates and the sources are commonly connected, the current flowing through the output transistors M11 to M1n is in proportion to the current Im2 flowing through the input transistor M2. As described above, the output transistors M11 to M1n have the size ratio of $1:2:4\ldots:2^{(n-1)}$. Assuming that the output transistor M11 and the input transistor M2 have the same transistor size, the constant current Ic flowing through the current output terminal 102 is expressed by the following equation:

$$Ic = a1 \times Im2 \times 2^0 + a2 \times Im2 \times 2^1 + \ldots + an \times Im2 \times 2^{(n-1)}$$

where a1, a2, . . . , and an are each bit of the digital signal DIG. Therefore, the constant current according to the digital signal DIG can be output. The current Im2 flowed through the input transistor M2 is given by the following equation using the reference current Iref:

$$Im2 = R2/R1 \times Iref$$

Consequently, according to the current DAC 100 of this embodiment, the amount of current corresponding to the LSB (least significant bit) of the current DAC 100 can be controlled by adjusting the reference current Iref and the resistors R1 and R2.

Additionally, the following effect can be obtained with the current DAC 100 of this embodiment. Generally, the current flowing through the N-type MOSFET is increased as the gate voltage Vg is set higher. However, in the usual current-mirror circuit in which the gate terminal of the input-side transistor is connected to the drain terminal, capability of the output-side transistor cannot be fully brought out, because the voltage at the gate terminal is not so high.

On the other hand, in the current DAC 100 of this embodiment, the capability of the transistor can be fully brought out, because the gate voltage Vg of the output transistor M1 and input transistor M2 can be set higher by setting the first resistor R1 to a lower resistance. That is, because the relation of Im2=R2/R1×Iref is held, when the resistor R1 is decreased, the current Im2 is increased, and thereby the gate voltage Vg is adjusted in a direction in which the input transistor M2 is further turned on. This means that the more current can flow through even if the transistor has the small size, the sizes of the output transistors M11 to M1n can be reduced, and therefore the size of the current DAC 100 can be reduced as a whole.

Second Embodiment

Figure 2:
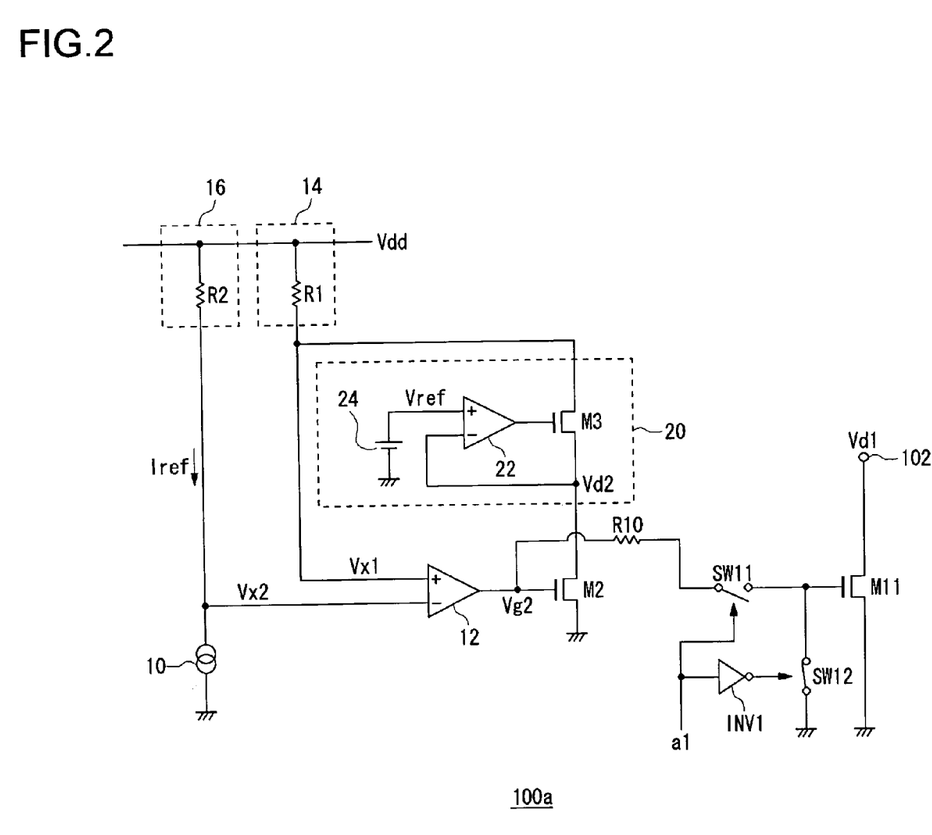
FIG. 2 is a circuit diagram showing a configuration of a current DAC according to a second embodiment.

A current DAC 100a according to a second embodiment further includes a voltage adjustment unit 20 which fixes the drain voltage of the input transistor M2 in addition to the current DAC 100 of the first embodiment.

FIG. 2 is a circuit diagram showing a configuration of a current DAC 100a according to a second embodiment. In the following drawings, the same or equivalent component as the first embodiment is denoted by the same numeral, descriptions will not be repeated.

The voltage adjustment unit 20 is connected between the first resistor R1 and the drain which is of one end of the input transistor M2, and the voltage adjustment unit 20 makes an adjustment such that a voltage Vd2 at the drain of the input transistor M2 is brought close to a predetermined reference voltage. In FIG. 2, the output transistors M12 to M1n are not shown. The voltage adjustment unit 20 includes an adjustment transistor M3, a second error amplifier 22, and a reference voltage source 24, to constitute a regulator circuit.

The adjustment transistor M3 is an N-type MOSFET, and connected to the input transistor M2 in series. That is, the source of the adjustment transistor M3 is connected to the drain of the input transistor M2, and the drain terminal is connected to the first resistor R1.

The reference voltage source 24 is another voltage generating means, such as a band gap reference circuit and a constant-voltage source, which generates a predetermined reference voltage Vref.

The reference voltage Vref generated by the reference voltage source 24 is input to the non-inverting input terminal of the second error amplifier 22. The voltage Vd2 of a connection point between the input transistor M2 and the adjustment transistor M3, that is, the drain terminal of the input transistor M2 is input to the inverting input terminal. The output terminal of the second error amplifier 22 is connected to the gate of the adjustment transistor M3.

The operation of the current DAC 100a having the above configuration will be described below. As the current DAC 100 of the first embodiment, the current DAC 100a of this embodiment generates the constant current Ic according to the digital signal DIG referencing to the reference current Iref.

First, characteristics of the conventional current-mirror circuit will be described in order to clarify the effect obtained by the current DAC 100a of this embodiment.

Figure 3:
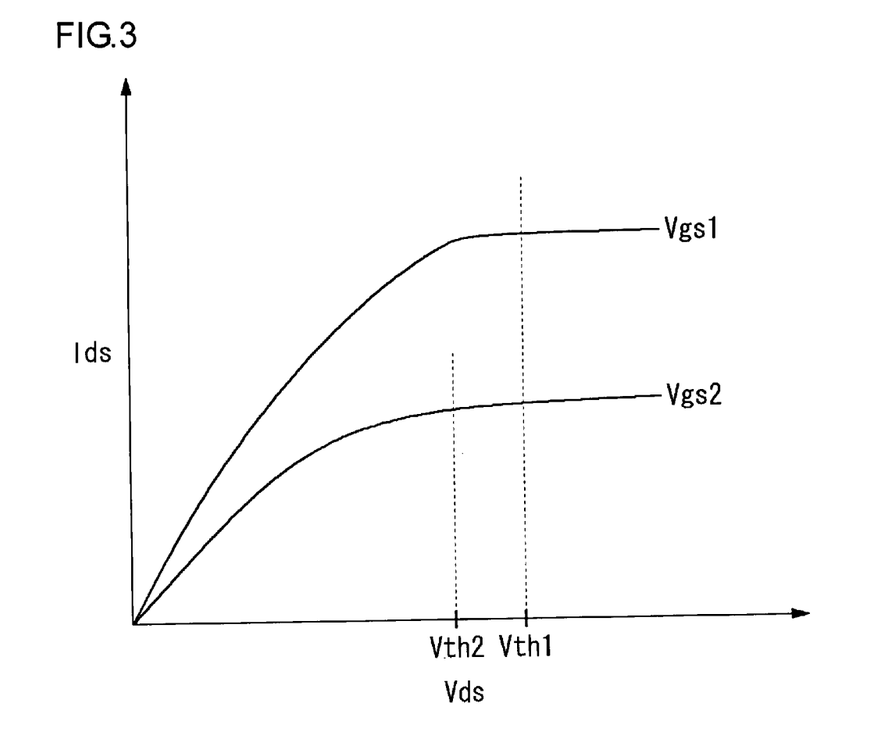
FIG. 3 shows current-voltage characteristics of MOSFET.

FIG. 3 shows current-voltage characteristics of MOSFET. Referring to FIG. 3, a horizontal axis indicates a drain-source voltage, a vertical axis indicates a drain-source current, and the current-voltage characteristics are shown for different gate-source voltages Vgs1 and Vgs2. In the figure, voltages Vth1 and Vth2 are threshold voltages of a constant current region and a non-constant current region for the gate-source voltages Vgs1 and Vgs2. As shown in the figure, in the non-constant current region (ohmic region) where the drain-source voltage is lower than the threshold voltage Vth, the drain-source current largely varies when the drain-source voltage varies.

Accordingly, in the conventional current-mirror circuit, the current flows through the transistor according to the size ratio of the transistors in the case where both of the two transistors are operated in the constant current region. However, when one of or both of the transistors are operated in the non-constant current region, a pair property of the transistors is lost, and thereby the current is not generated according to the size ratio.

The description is returned to the current DAC 100a of this embodiment.

As described above, in the voltage adjustment unit 20, the second error amplifier 22 adjusts the gate voltage of the adjustment transistor M3, which is the output of the second error amplifier 22, in order to equalize the voltages applied to the non-inverting input terminal and inverting input terminal. As a result, an on-resistance of the adjustment transistor M3 is adjusted to provide feedback such that the reference voltage Vref is equalized to the drain voltage Vd2 of the input transistor M2.

As described above, when the drain-source voltages of the two transistors constituting the current-mirror circuit differ from each other, the current-mirror circuit is not correctly operated in the non-constant current region. However, according to the output transistor M1 and input transistor M2 of this embodiment, the drain-source voltages of the two transistors can be equalized to each other due to the existence of the voltage adjustment unit 20. Therefore, the transistors can be operated while the same voltages are applied to the three terminals of the transistors, and the current according to the size ratio can flow even in the non-constant current region.

Assuming that the reference voltage Vref is set to the same value as the voltage Vd1 at the current output terminal 102, the substantially same voltages are applied to the three terminals in the output transistor M1 and the input transistor M2. In other words, even if the transistor is operated in the ohmic region where the drain-source voltage is low, the output transistor M1 and the input transistor M2 can accurately generate the currents in proportion to the transistor sizes respectively.

An electric power consumed in the current DAC 100a is decreased if the drain-source voltages of the output transistor M1 and input transistor M2 are low. As described above, when the reference voltage Vref is set to the same value as the voltage Vd1 at the current output terminal 102, the constant current can accurately be generated according to the mirror ratio even if the output transistor M1 and the input transistor M2 are operated in the ohmic region. Accordingly, in the current DAC 100a of this embodiment, by setting the reference voltage Vref and the voltage Vd1 at the current output terminal 102 such that the output transistor M1 and the input transistor M2 are operated in the ohmic region, which allows the power consumption in the current DAC 100a to be reduced.

In the conventional current-mirror circuit, it is necessary to increase the drain-source voltage to fully drive the transistor, when the gate-source voltages of the output transistor M1 and input transistor M2 are increased. This is because the threshold voltage Vth is increased when the gate-source voltage is increased, as shown in FIG. 3.

On the other hand, in the current DAC 100a of this embodiment, the drain-source voltage of each of the output transistor M1 and the input transistor M2, that is, the reference voltage Vref and the voltage Vd2 at the current output terminal 102 can be kept low, because the pair property of the two transistors is maintained even if the gate-source voltage is set to a large value in order to fully bring out the capabilities of the output transistor M1 and input transistor M2.

Third Embodiment

Figure 4:
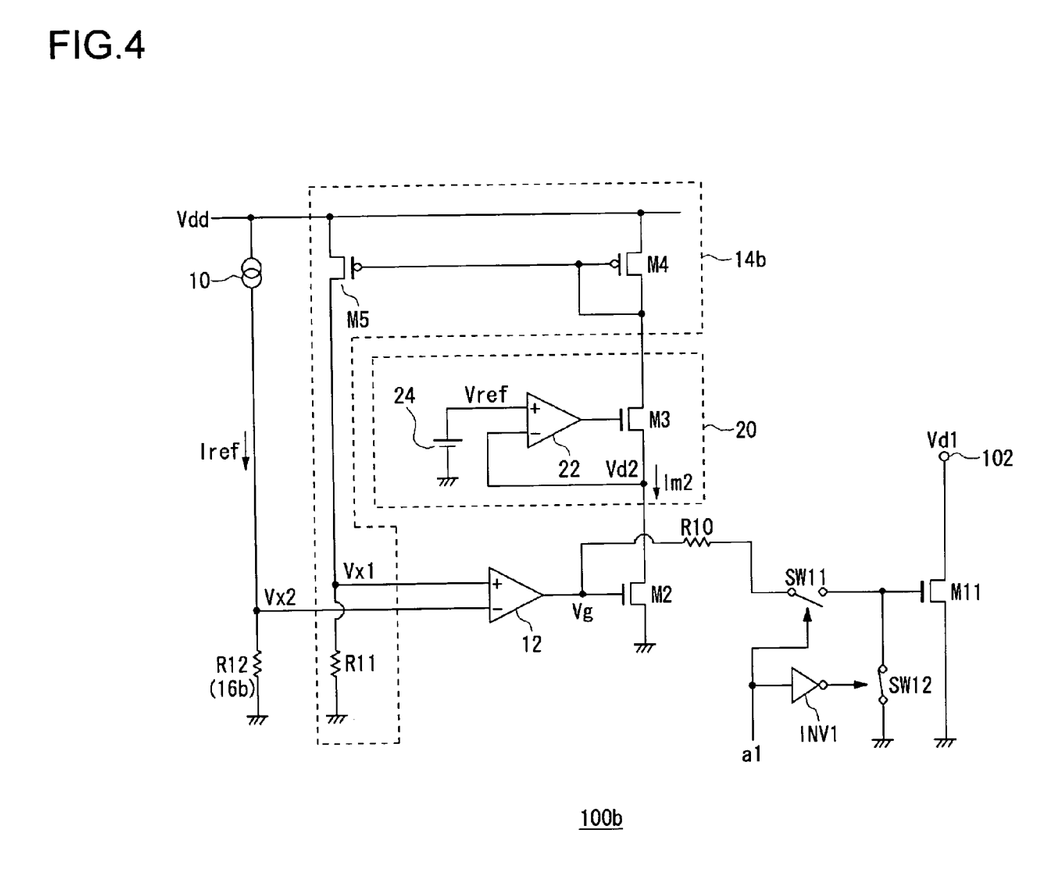
FIG. 4 is a circuit diagram showing a configuration of a current DAC according to a third embodiment.

A current DAC 100b according to a third embodiment is a modification of the current DAC 100a of the second embodiment and the configuration of the current-to-voltage conversion unit 14 differs from that in the second embodiment. FIG. 4 is a circuit diagram showing a configuration of a current DAC 100b according to this embodiment. In FIG. 4, the output transistors M12 to M1n are not shown as in FIG. 2.

A first current-to-voltage conversion unit 14b of FIG. 4 includes a first detection transistor M4, a second detection transistor M5, and a first reference resistor R11. The first detection transistor M4 is provided on the same current path as the input transistor M2. The first detection transistor M4 is a P-type MOSFET in which the source is connected to the power supply terminal and the drain and gate are connected to the drain of the adjustment transistor M3. The second detection transistor M5 is connected to the first detection transistor M4 in the current-mirror manner. The first reference resistor R11 is provided on the same current path as the second detection transistor M5. In the first reference resistor R11, the potential at one end is fixed by the ground voltage which is of the common fixed voltage.

A second current-to-voltage conversion unit 16b is provided on the path of the reference current Iref generated by the constant current source 10, and includes a second reference resistor R12. The potential at one end of the second reference resistor R12 is fixed by the ground voltage which is of the common fixed voltage.

The potentials Vx1 and Vx2 at the other ends of the first reference resistor R11 and second reference resistor R12, as outputs of the first current-to-voltage conversion unit 14b and second current-to voltage conversion unit 16b, are input to the non-inverting input terminal and inverting input terminal of the first error amplifier 12 respectively.

The size ratio of the first detection transistor M4 and the second detection transistor M5 is set to M:1. Here, M is a real number satisfying M>1. The current Im2 flowing through the input transistor M2 is flowed through the first detection transistor M4, and the current of Im2/M is flowing through the second detection transistor M5. Consequently, the output voltage Vx1 of the first current-to-voltage conversion unit 14b becomes Im2/M×R11. On the other hand, the output voltage Vx2 of the second current-to-voltage conversion unit 16a becomes Iref×R12. In the current DAC 100b of FIG. 4, the first error amplifier 12 provides the feedback such that the relation Vx1=Vx2 is held, and the following equation is held:

$$Iref \times R12 = Im2/M \times R11$$

That is, the current of the input transistor M2 is stabilized to the value obtained by the following equation:

$$Im2 = Iref \times M \times R12/R11$$

According to the current DAC 100b of this embodiment, the same effect, as the case in which the first resistor R1 is set to the small value in the current DAC 100a of the second embodiment, can be obtained by setting the constant M to a large value.

Fourth Embodiment

Figure 5:
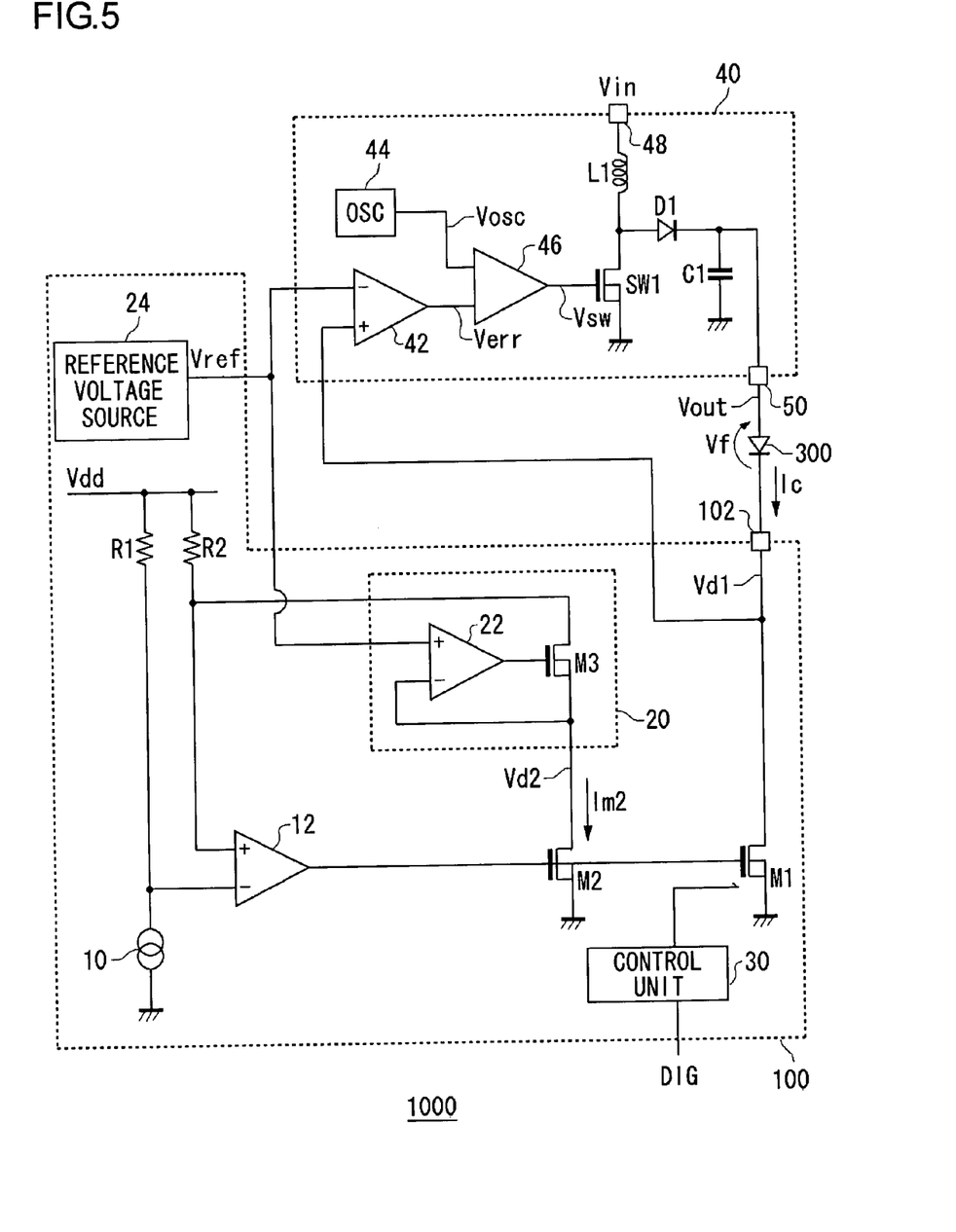
FIG. 5 is a circuit diagram showing a configuration of a light emitting apparatus according to a fourth embodiment.

A fourth embodiment of the invention is a light emitting apparatus including an LED which is a light emitting device. The light emitting apparatus of this embodiment is mounted on a battery-driven electronic instrument such as a portable telephone and PDA. An LED is provided as the back light of the liquid crystal panel or the light emitting device for notifying a user of incoming call.

FIG. 5 is a circuit diagram showing a configuration of a light emitting apparatus 1000 of this embodiment. The light emitting apparatus 1000 includes an LED 300, a voltage generation unit 40, and the current DAC 100.

Although the current DAC 100a of the second embodiment is used as the current DAC 100 in FIG. 5, the current DACs 100 of other embodiments maybe used. In FIG. 5, then output transistors M11 to M1n are shown as one transistor.

A cathode terminal of the LED 300 is connected to the current output terminal 102 of the current DAC 100a. The emission brightness of LED 300 is controlled by the constant current Ic generated by the current DAC 100 in accordance with the digital signal DIG. To an anode terminal of LED 300, an output terminal 50 of the voltage generation unit 40 is connected, and an output voltage Vout of the voltage generation unit 40 is applied.

The voltage generation unit 40 is a switching regulator and output the voltage Vout which is obtained by boosting the input voltage Vin, which is input to the input terminal 48, from the output terminal 50. To the input terminal 48, voltage is input from the battery. The voltage generation unit 40 includes a switching element SW1, a rectifying diode D1, an inductor L1, an output capacitor C1, a third error amplifier 42, an oscillator 44, and a voltage comparator 46. The voltage generation unit 40 may be a synchronous rectification type switching regulator.

To the non-inverting input terminal of the third error amplifier 42, the voltage Vd1 of the current output terminal 102 is input. To the inverting input terminal, the reference voltage Vref output from the reference voltage source 24 of the current DAC 100a is applied. The third error amplifier 42 outputs an error voltage Verr which is obtained by amplifying an error voltage between the voltage Vd1 and the reference voltage Vref. The error voltage Verr is input to the voltage comparator 46.

The oscillator 44 generates a periodic voltage Vosc having a triangular or sawtooth waveform and outputs the periodic voltage Vosc to the voltage comparator 46.

The voltage comparator 46 compares the error voltage Verr and the periodic voltage Vosc, and generates a switching signal Vsw switching between a high level and a low level according to the magnitude correlation between the error voltage Verr and the periodic voltage Vosc. Thus generated switching signal Vsw is a pulse-width modulated signal whose ratio of the high-level period and the low-level period, that is, a duty ratio varies.

The switching signal Vsw is input through a driver circuit (not shown) to the gate terminal of MOSFET which is the switching element SW1. The switching element SW1 is turned on when the switching signal Vsw is in the high level, and turned off when the switching signal Vsw is in the low level.

By turning on/off the switching element SW1, energy conversion is performed with an inductor L1 and an output capacitor C1 to boost the input voltage applied to the input terminal 48. The boosted voltage is smoothed by the output capacitor C1, and output as the direct-current output voltage Vout. The output signal Vout generated by the voltage generation unit 40 is supplied to The LED 300 as a drive voltage to.

The operation of the light emitting apparatus 1000 having the above configuration will be described below.

As a result of the drive of LED 300 which is of a load circuit, a voltage of Vd1=Vout−Vf emerges at the current output terminal 102 of current DAC 100a. Vf is a forward voltage of LED 300.

The switching signal Vsw in the voltage generation unit 40 is generated such that the two voltages Vref and Vd1 input to the third error amplifier 42 are equalized to each other. Accordingly, the output voltage Vout of the voltage generation unit 40 is stabilized such that the relation Vout=Vd1+Vf=Vref+Vf is held.

At this point, in the current DAC 100a, the voltage adjustment unit 20 makes an adjustment such that the voltage Vd2 at the drain terminal of the input transistor M2 is brought close to the reference voltage Vref.

As a result, the control is performed such that the voltage Vd1 at the current output terminal 102 is equalized to the voltage Vd2 at the drain terminal of the input transistor M2.

In the current DAC 100a of this embodiment, the output transistor M1 and the input transistor M2 constitute the current-mirror circuit the voltages at the drain terminals in addition to the gate terminals and source terminals are adjusted so as to be equalized to each other. Accordingly, the output transistor M1 can accurately amplify the current Im2 flowed through the input transistor M2 according to each bit of the digital signal DIG, and can flow the constant current Ic through LED 300.

Conventionally, it is necessary that the output transistor M1 is operated in the saturation region (constant current region), accordingly it is necessary that the voltage at the current output terminal 102 is controlled at 0.3V or more, for example.

On the other hand, in the current DAC 100a of this embodiment, as described in the second embodiment, the output transistor M1 and the input transistor M2 maintains the pair property between the two transistors even in the ohmic region, so that the output transistor M1 can be operated in the ohmic region. Therefore, the reference voltage Vref can be set to 0.1V, for example. As a result, the power consumption in the output transistor M1 and the input transistor M2 can be reduced to improve efficiency of the light emitting apparatus 1000.

The above embodiments are described only by way of example, it will be obvious to those skilled in the art that the modifications and changes can be made in combinations of components or processes without departing from the spirit and scope of the invention.

Figure 6:
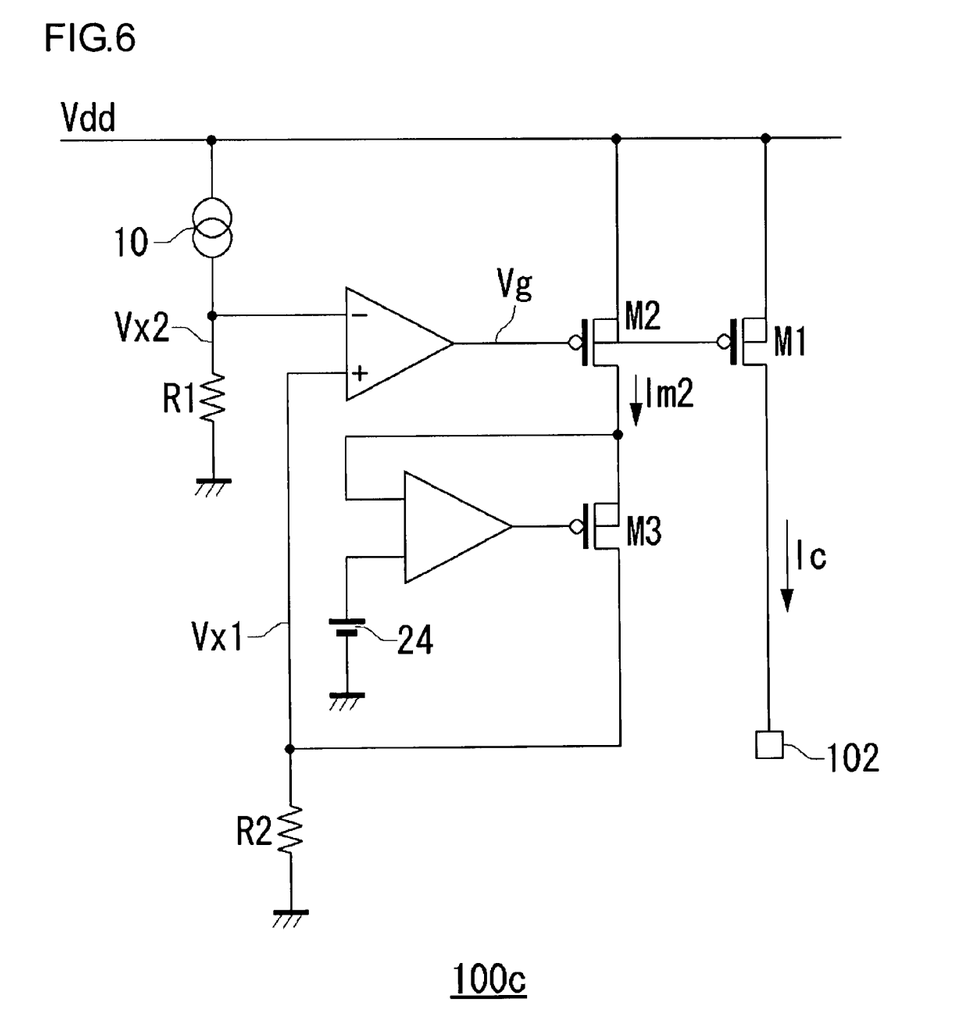
FIG. 6 is a circuit diagram showing a modification of the current DAC according to the second embodiment.

FIG. 6 is a circuit diagram showing a modification of the current DAC according to the second embodiment. In a current DAC 100c of the modification, the N-type and P-type MOSFETs are replaced with each other. The current DAC 100c also can flow the constant current Ic through the circuit connected to the current output terminal 102. The current DAC 100c of the modification can suitably used in the case where the circuit connected to the current output terminal 102 has the small voltage drop or in the case where a negative power supply can be used in the electronic instrument.

Although MOSFET is used as the transistors in the above embodiments, other type of transistors such as a bipolar transistor maybe used. Such selections maybe determined according to design specifications required for the constant current circuit and semiconductor manufacturing processes used.

In the embodiments, the elements constituting the constant current circuit, the power supply device, and the like may be integrated on a single semiconductor substrate, and part of the elements may be formed as discrete components. The integration of the components may be determined according to the semiconductor manufacturing processes used, cost, an occupied area, and the like.

In the embodiments, the switching regulator is used as the voltage generation unit 40. However, an insulating type switching regulator, a charge pump circuit, a three-terminal regulator, and the like may be used as the voltage generation unit 40.

While the preferred embodiments of the present invention have been described using specific terms, such description is for illustrative purposes only, and it is to be understood that changes and variations may be made without departing from the spirit or scope of the appended claims.

What is claimed is:

1. A current-output type digital-to-analog converter which receives ann-bit (n is a natural number) digital signal and outputs a constant current from a current output terminal according to the input digital signal, comprising:
   n output transistors each of which has a first terminal, the potential of which is fixed by a common fixed voltage and a second terminal located on a side opposite the first terminal and connected to the current output terminal;
   an input transistor of which has a first terminal and a control terminal commonly connected to those of the n output transistors;
   a first current-to-voltage conversion unit which is connected onto a second terminal side of the input transistor to convert a current flowing through the input transistor into a voltage;
   a constant current source which generates a reference current;
   a second current-to-voltage conversion unit which converts the reference current into a voltage;
   a first error amplifier to which, each of output voltages of the first and second current-to-voltage conversion units are input to adjust voltages at the control terminals of the input transistor and the n output transistors;
   n switches which are provided on a path through which an output of the first error amplifier reaches the control terminals of the n output transistors; and
   a control unit which controls on/off of the n switches according to the n-bit digital signal.

2. The current-output type digital-to-analog converter according to claim 1, further comprising a voltage adjustment unit which is connected to the second terminal of the input transistor to make an adjustment to bring a voltage at the second terminal of the input transistor close to a predetermined reference voltage.

3. The current-output type digital-to-analog converter according to claim 2, wherein
   the voltage adjustment unit includes:
   an adjustment transistor which is connected to the input transistor in series; and
   a second error amplifier to which a voltage at a connection point between the input transistor and the adjustment transistor and the predetermined reference voltage are input to adjust a voltage at a control terminal of the adjustment transistor.

4. The current-output type digital-to-analog converter according to claim 2, wherein
   the predetermined reference voltage is set to the same voltage as that at the current output terminal.

5. The current-output type digital-to-analog converter according to claim 3, wherein
   the predetermined reference voltage is set to the same voltage as that at the current output terminal.

6. The current-output type digital-to-analog converter according to claim 4, wherein
the predetermined reference voltage is set to operate the input transistor in a non-constant current region.

7. The current-output type digital-to-analog converter according to claim 5, wherein
the predetermined reference voltage is set to operate the input transistor in a non-constant current region.

8. The current-output type digital-to-analog converter according to claim 1, wherein
the first current-to-voltage conversion unit includes:
a first detection transistor which is provided on the same current path as the input transistor;
a second detection transistor which is connected to the first detection transistor in a current-mirror manner; and
a first reference resistor which is provided on the same current path as the second detection transistor and one end of the first reference resistor is fixed by the common fixed voltage,
the second current-to-voltage conversion unit includes a second reference resistor which is provided on path of the reference current, a potential at one end of the second reference resistor being fixed by the common fixed voltage, and
a potential at the other end of each of the first and second reference resistors is input as outputs of the first and second current-to-voltage conversion units to the first error amplifier.

9. A load driving apparatus comprising:
a current-output type digital-to-analog converter which generates an output current according to an input n-bit (n is a natural number) digital signal and outputs the output current from a current output terminal; and
a voltage generation unit which supplies a drive voltage to a load circuit connected to the current output terminal of the current-output type digital-to-analog converter, wherein
the current-output type digital-to-analog converter includes:
n output transistors each of which has a first terminal, the potential of which is fixed by a common fixed voltage and a second terminal located on a side opposite the first terminal and connected to the current output terminal;
an input transistor of which has a first terminal and a control terminal commonly connected to those of the n output transistors;
a first current-to-voltage conversion unit which is connected onto a second terminal side of the input transistor to convert a current flowing through the input transistor into a voltage;
a constant current source which generates a reference current;
a second current-to-voltage conversion unit which converts the reference current into a voltage;
a first error amplifier to which, each of output voltages of the first and second current-to-voltage conversion units are input to adjust voltages at the control terminals of the input transistor and the n output transistors;
an switches which are provided on a path through which an output of the first error amplifier reaches the control terminals of the n output transistors; and
a control unit which controls on/off of the n switches according to the n-bit digital signal.

10. The load driving apparatus according to claim 9, wherein
the current-output type digital-to-analog converter further includes a voltage adjustment unit which is connected to the second terminal of the input transistor to make an adjustment to bring a voltage at the second terminal of the input transistor close to a predetermined reference voltage,
the voltage generation unit generates the drive voltage to bring a voltage at the current output terminal of the constant current circuit close to the reference voltage as a result of drive of the load circuit.

11. An electronic instrument comprising:
a light emitting device; and
the load driving apparatus according to claim 9 which drives the light emitting device as a load circuit.

* * * * *